United States Patent [19]
Ackley et al.

[11] Patent Number: 5,317,587
[45] Date of Patent: May 31, 1994

[54] VCSEL WITH SEPARATE CONTROL OF CURRENT DISTRIBUTION AND OPTICAL MODE

[75] Inventors: Donald E. Ackley; Chan-Long Shieh, both of Paradise Valley, Ariz.

[73] Assignee: Motorola, Inc., Schaumburg, Ill.

[21] Appl. No.: 925,139

[22] Filed: Aug. 6, 1992

[51] Int. Cl.⁵ ............................................. H01S 3/19
[52] U.S. Cl. ........................................ 372/45; 372/96; 372/99; 437/129
[58] Field of Search ................... 372/45, 46, 96, 99; 437/129

[56] References Cited

U.S. PATENT DOCUMENTS

| | | | |
|---|---|---|---|
| 4,665,527 | 5/1987 | Akiba et al. | 372/46 |
| 4,873,696 | 10/1989 | Coldren et al. | 372/46 |
| 4,943,970 | 7/1990 | Bradley | 372/46 |
| 5,034,092 | 7/1991 | Lebby et al. | 156/646 |
| 5,068,868 | 11/1991 | Deppe et al. | 372/46 |
| 5,111,467 | 5/1992 | Bradley | 372/29 |
| 5,115,441 | 1/1992 | Kopf et al. | 372/45 |
| 5,212,703 | 5/1993 | Kahen | 372/46 |

Primary Examiner—Georgia Y. Epps
Attorney, Agent, or Firm—Eugene A. Parsons

[57] ABSTRACT

A VCSEL formed on a substrate with an upper mirror stack etched to form a mesa shaped area with material positioned on the upper mirror stack including optically transparent, electrically conductive material defining an electrical contact window to control current distribution within the laser, and material positioned on the surface of the mesa shaped area with an optical thickness selected to provide a desired mirror reflectivity profile which controls the optical mode independently of the mesa edges, thereby, providing separate control of the current and the optical mode.

22 Claims, 2 Drawing Sheets

VCSEL WITH SEPARATE CONTROL OF CURRENT DISTRIBUTION AND OPTICAL MODE

The present invention pertains to vertical cavity surface emitting lasers and more specifically to separate control of current distribution and the optical mode during manufacture of the vertical cavity surface emitting laser.

BACKGROUND OF THE INVENTION

Conventional edge emitting semiconductor lasers are playing a significant role in development of optical communications due to their high operating efficiency, small size and modulation capabilities. However, with increasing performance needs, further reduction in size, and greater manufacturing needs, these devices have been experiencing limitations.

Recently, there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

However, even with these advances in deposition techniques there is difficulty during manufacturing in controlling the mode of operation of the laser and in controlling current distribution within the laser. In general, VCSELs are formed by depositing a plurality of layers on a substrate and then etching the layers down to the substrate to form the VCSEL. See, for example, U.S. Pat. No. 5,034,092, entitled "Plasma Etching of Semiconductor Substrates", issued Jul. 23, 1991, assigned to the same assignee and included herein by reference.

The etching of mesas to form VCSELs has two disadvantages. The etching process damages the crystal at the surface and leads to increased threshold currents and reduced reliability. The mesas form a waveguide with a large discontinuity in the refractive index which makes it very difficult to control the optical modes without making devices of very small dimension, which increases the series resistance and reduces the maximum output power. Generally this results in devices which are less efficient and less stable.

SUMMARY OF THE INVENTION

It is a purpose of the present invention to provide a new and improved VCSEL with separate control of current distribution and the optical mode.

It is a further purpose of the present invention to provide VCSELs with separate control of current distribution and the optical mode so that characteristics such as size, efficiency, power output, etc. can be optimized.

These and other purposes and the solution to many of the above problems are realized in a method of manufacturing a vertical cavity surface emitting laser with separate control of current distribution and optical mode, including the steps of providing a substrate, forming a first parallel stack of mirrors on the substrate, forming an active and spacer layer on the first parallel mirror stack, forming a second parallel mirror stack on the active and spacer layer, and depositing material on the second parallel mirror stack having an optical thickness which provides a predetermined reflectivity profile for the second parallel mirror stack to control the optical mode of the laser.

These and other purposes and the solution to many of the above problems are further realized in a vertical cavity surface emitting laser with separately controlled current distribution and optical mode including, a substrate, a first parallel stack of mirrors positioned on the substrate, an active and spacer layer positioned on the first parallel mirror stack, a second parallel mirror stack positioned on the active and spacer layer, and material positioned on the second parallel mirror stack having an optical thickness such that the second parallel mirror stack has a predetermined reflectivity profile.

BRIEF DESCRIPTION OF THE DRAWINGS

Referring to the drawings.

DESCRIPTION OF THE PREFERRED EMBODIMENT

Figure 1:
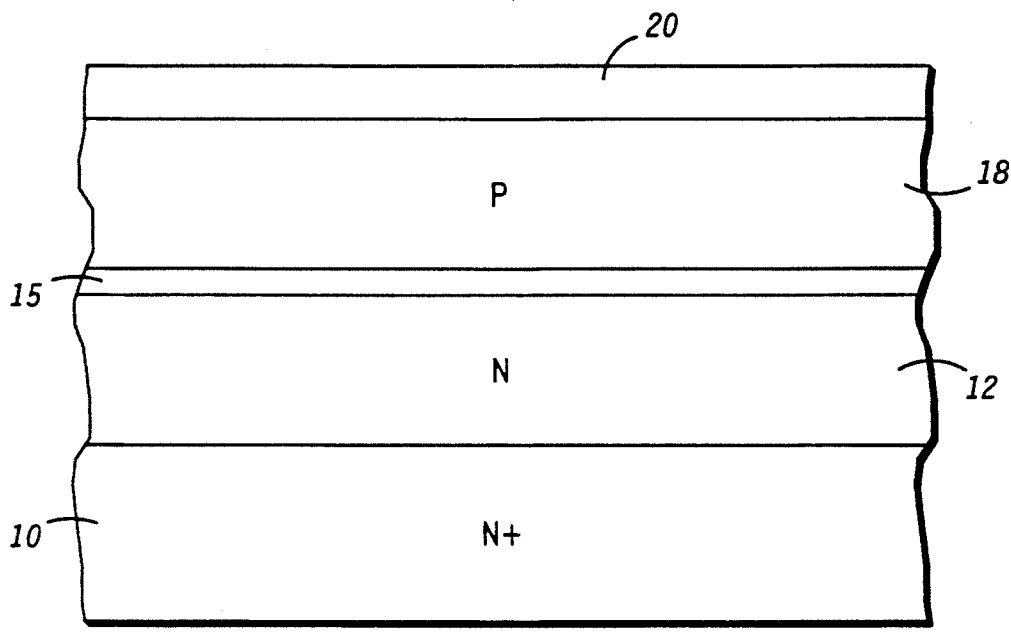
FIG. 1 is a view in cross section of an intermediate step in the process of manufacturing VCSELs.

Referring specifically to FIG. 1, a view in cross section of an intermediate step in the process of manufacturing VCSELs is illustrated. The VCSEL is formed on a substrate 10, which in this example, is made of N-doped gallium arsenide. Gallium arsenide is used as substrate 10 to facilitate epitaxial growth of multiple layers of aluminum gallium arsenide. It should be understood that other semiconductor substrates could be used as well.

Epitaxial deposition of multiple alternate layers of different compositions is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, indium phosphide or the like. Fabrication of VCSEL devices use epitaxial deposition extensively to produce the multitude of layers of different materials which make up the device.

Deposition of alternating layers of N doped aluminum gallium arsenide with low (<15%) and high (>80%) aluminum mole fractions form a first stack 12 of reflectors or mirrors. Thicknesses of alternating layers of aluminum gallium arsenide are set at approximately one quarter of the wavelength at which the VCSEL is designed to operate.

A typical active and spacer layer 15 includes a cladding region epitaxially deposited on first mirror stack 12 to form a first major surface of active layer 15. An active region is epitaxially deposited on the cladding region and a second cladding region is epitaxially deposited to form a second major surface of active and spacer layer 15.

A second stack 18 of reflectors or mirrors is epitaxially deposited on the second cladding region of active and spacer layer 15. Second mirror stack 18 is composed of alternating layers of P doped aluminum gallium arsenide with alternating mole fractions as used in first mirror stack 12. Thickness of the last alternating layer is approximately a multiple of one quarter wave length instead of a single quarter wave length as is used for the other alternating layers. Generally, the threshold current of a VCSEL is reduced by increasing the number of alternating layers in mirror stacks 12 and 18.

Once first mirror stack 12, active layer 15 and second mirror stack 18 are completed, the structure is patterned to form one or more individual VCSELs. In the present specific embodiment the patterning is accomplished as follows. The upper surface of second mirror stack 18 is provided with a layer of photoresist material 20 in any of the well known methods. Photoresist layer 20 is exposed and material is removed to define the position and size of a trench. The trench is then formed by etching mirror stack 18 by any convenient means, such as ion milling or the etch processes disclosed in U.S. Pat. No. 5,034,092, entitled "Plasma Etching of Semiconductor Substrates", issued Jul. 23, 1991 and assigned to the same assignee. In general, the trench extends completely around and defines a generally mesa shaped area, which in this specific embodiment has a generally circular cross-section.

In the field of VCSELs if the mirror stacks are etched completely through to the substrate the laser is sometimes referred to as a "mesa device" and if the etching is performed partially through the upper mirror stack the laser is sometimes referred to as a "ridge-guide device". In this disclosure either type of etching could be performed and, therefore, the etched area is referred to throughout as a trench and the area defined by the trench is referred to as a mesa shaped area. It should be understood, however, that the partially etched, top emitting VCSEL is the device in which it is believed that the present invention is the most useful and, accordingly, that is the device that will be described in detail with the application to other devices being understood.

Figure 2:
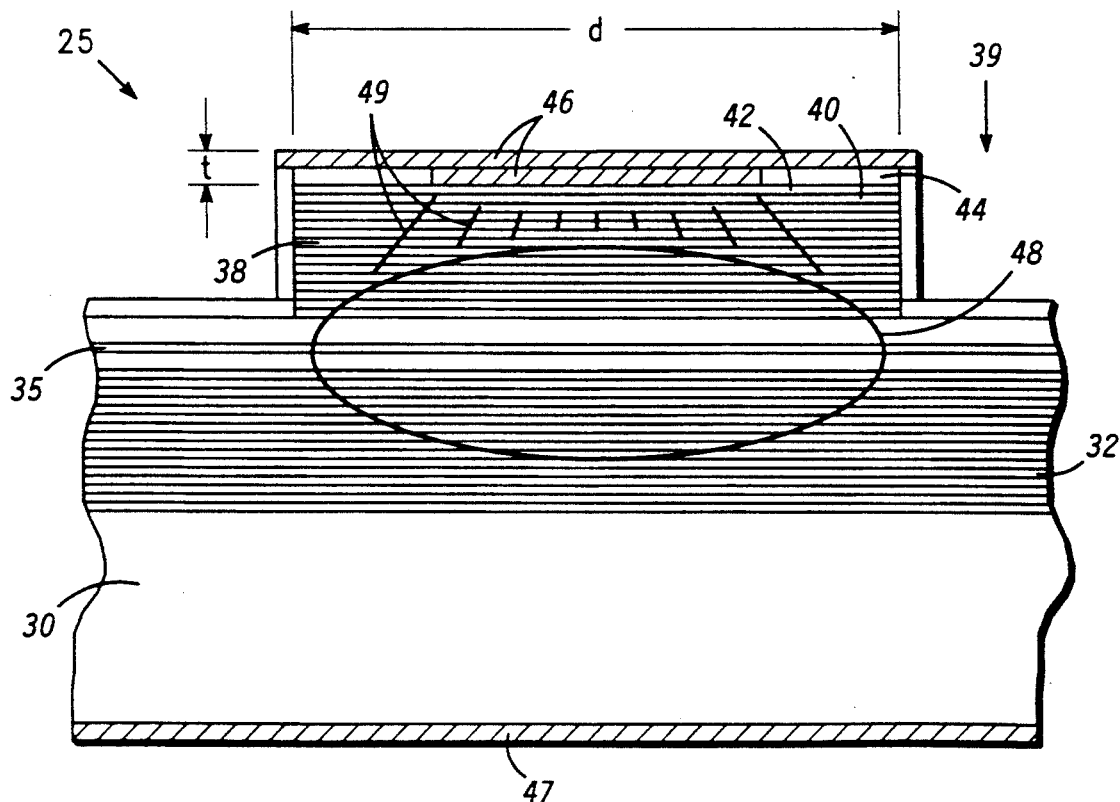
FIG. 2 is a view in cross section of a VCSEL manufactured in accordance with the present invention.

Referring specifically to FIG. 2, a top emitting VCSEL 25 is illustrated in cross section. VCSEL 25 is formed on a substrate 30 and includes a lower parallel mirror stack 32 formed on substrate 30, an active and spacer layer 35 formed on parallel mirror stack 32 and an upper parallel mirror stack 38 formed on active and spacer layer 35. Upper parallel mirror stack 38 is etched vertically substantially to active and spacer layer 35 to form a trench 39 surrounding the remainder of upper parallel mirror stack 38. The remaining portion of upper parallel mirror stack 38 defined by trench 39 is a mesa shaped area 40.

The operating wavelength (frequency) of VCSEL 25 is already determined by the construction (material, etc.) and dimensions of active and spacer layer 35 and the dimensions of mirror stacks 32 and 38. Further, as is well known in the art, VCSELs are desired to operate in a lowest order mode. The mode size, or the maximum volume that can be utilized to sustain the lowest order mode of operation is determined by the optical characteristics of the mirror stacks 32 and 38. The diameter, d, of mesa shaped area 40 is generally approximately the greatest area that will support operation in the lowest order mode without including any higher order modes of operation. Since lasing only occurs within the volume of mesa shaped area 40, and below, masking the structure for etching of trench (or trenches) 39 is not crucial. In general, the depth of trench 39 will be such that no contact with active and spacer layer 35 is made, so that reliability is enhanced. Also, the width of trench 39 is not crucial and may be any convenient width, depending upon the application and following manufacturing steps.

A layer 44 of dielectric material, such as silicon nitride (SiNx), is deposited over the entire surface of VCSEL 25 and an opening is etched therethrough on the upper surface of mesa shaped area 40 to generally coincide with and define a light emitting area. A transparent metal contact layer 46 is deposited in the emitting area and continued over mesa shaped area 40 to define an electrical contact window 42 and to provide sufficient surface for an external electrical contact. Generally, the transparent metal utilized is indium tin oxide (ITO), cadmium tin oxide, or the like. Additional conventional metal may be deposited on layer 46, if desired. It should be noted that electrical contact window 42 basically controls the current distribution within upper parallel mirror stack 38.

VCSEL 25, illustrated in FIG. 2 uses dielectric current confinement in addition to transparent metal contacts and a mesa shaped area to separately control the injected current distribution and the optical mode. In this specific embodiment VCSEL 25 is fabricated (from the basic structure of parallel mirror stacks 32 and 38 and active and spacer layer 35) by first depositing an SiNx layer and opening a contact window. A transparent metal contact, ITO, is then deposited and patterned into dots concentric with the contact window. The ITO layer and parallel mirror stacks are then etched to form the optical waveguide structure, either partially, or totally, through the mirror stacks. A second layer of dielectric material is then deposited to cover the sidewalls and area outside mesa shaped area 40, and a second layer of ITO is deposited to form-the contact layer. VCSEL 25 is completed with a mesa isolation etch and the formation of a back side contact 47.

The operating mode of VCSEL 25 is indicated in FIG. 2 by oval 48 and the injection current distribution (or confinement) is indicated by lines 49.

The use of dielectric layer 44 serves a dual purpose. First, it confines the operating current to the center of mesa shaped area 40 thereby allowing more efficient overlap with the fundamental optical mode in large ($\geq 20$ microns) devices. Second, in combination with the transparent metal layer, or layers, 46 the dielectric layer significantly effects the reflectivity of upper parallel mirror stack 38. For example, if the total optical thickness, t, of dielectric layer 44 plus contact layer 46 is a multiple of half the wavelength of the VCSEL emission, the cavity Q of the resonator (mesa shaped active area 40) is unchanged from the Q of a bare resonator structure, which is about 350 in this specific embodiment. However, if thickness t of dielectric layer 44 plus contact layer 46 equals an odd multiple of quarter wavelengths, the resonator Q is reduced to only 20% of the maximum value. Thickness variations between the two examples can provide for intermediate loss differences. Thus, layers positioned on top of mesa shaped area 40 have a dramatic effect on resonator (mirror) losses and, hence, on the effective lateral waveguiding in the structure of VCSEL 25. By controlling the thickness of layers 44 and 46 the mirror reflectivity is spatially varied, which controls the optical mode independent of the diameter, d, of mesa shaped area 40.

The optical thickness of a layer of material is equal to the actual thickness multiplied by the index of refraction of the material. The index of refraction of ITO material, for example, is approximately 2.0-2.2. Thus, the actual thickness of a layer of ITO with an optical thickness of one half wavelength is approximately equal to one quarter wavelength at the emission frequency of the device.

Figure 3:
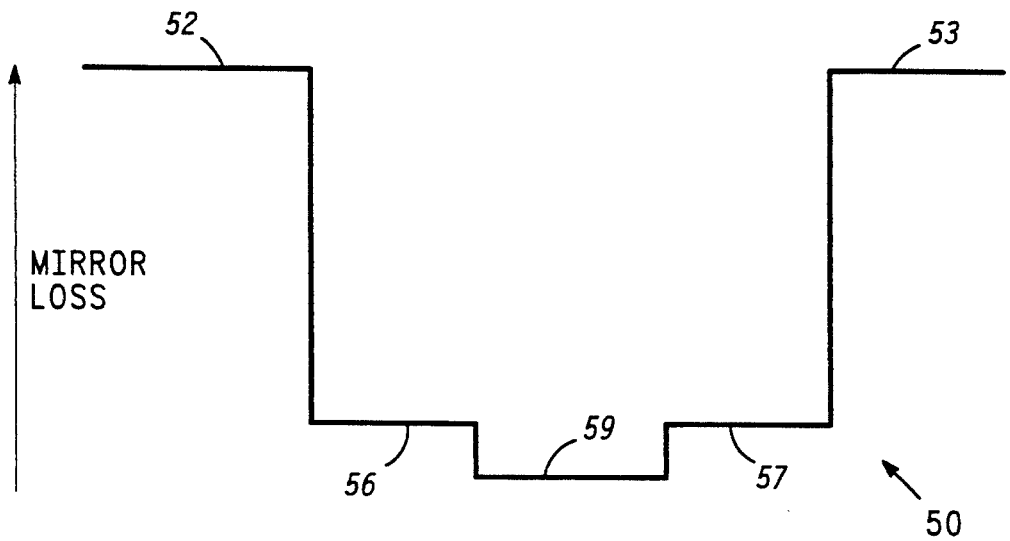
FIG. 3 is a graphical representation of the mirror loss, or reflectivity profile, in a VCSEL similar to that of FIG. 2.
Figure 4:
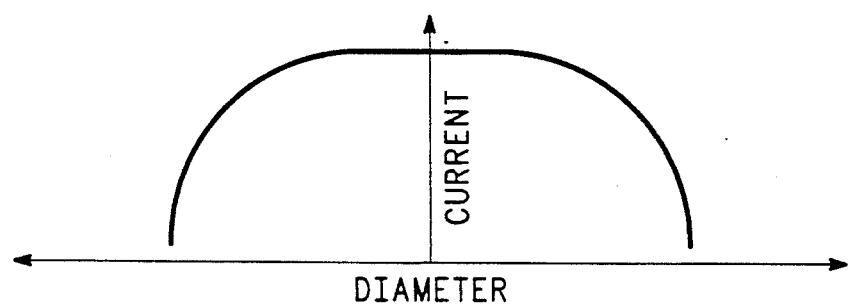
FIG. 4 is a graphical representation of the current configuration in the VCSEL of FIG. 3.

Referring specifically to FIG. 3, a graphical representation of the mirror loss, or reflectivity profile 50, in a VCSEL similar to VCSEL 25 is illustrated. Also, FIG. 4 is positioned with respect to FIG. 3 to provide a graphical representation of the current configuration relative to reflectivity profile 50, in the VCSEL of FIG. 3. Reflectivity profile 50 includes outermost lines 52 and 53, coinciding with trench 39, wherein the mirror loss is a maximum. At the inner ends of each of the lines 52 and 53 the mirror loss drops off sharply, indicating the beginning of mesa shaped area 40. Lines 56 and 57, immediately inward from the sharp drop offs of mirror loss, indicate the mirror loss from the outer edge of mesa shaped area 40 to the outer limits of electrical contact window 42. In this particular embodiment the combined optical thickness of dielectric layer 44 and final ITO layer 46 thereover is a variation between a multiple of one half wavelength and an odd multiple of one quarter wavelength. Also in this particular embodiment, transparent metal contact 46 over electrical contact window 42 is constructed to have a thickness, t, equal to a multiple of one half the operating wavelength. Thus, the mirror loss again drops off sharply at electrical contact window 42 to a line 59 indicating a minimum mirror loss in electrical contact window 42.

This configuration resembles a separate confinement heterostructure (SCH) which has two waveguiding regions. The reflectivity profile 50 of the VCSEL is adjusted by controlling the thickness of layers 44/46 to spatially vary the mirror reflectivity and control the optical mode independently of the mesa edges. By controlling the reflectivity profile of VCSEL 25 the operating volume of the laser is set substantially equal to the mode size of the operating, or lowest order, mode and an output or emitting area of VCSEL 25 is maximized. Maximizing the emitting area of VCSEL 25 maximizes the output power thereof. Using this configuration the lateral overlap of the gain (current lines 49) and the optical mode (oval 48), which is the controlling factor in determining the threshold and external efficiency of small diameter devices, may be maximized for the most efficient operation. This is especially true in the case where the device diameter, d, is larger than the current spreading and higher order optical modes have poor overlap with the optical gain.

Figure 5:
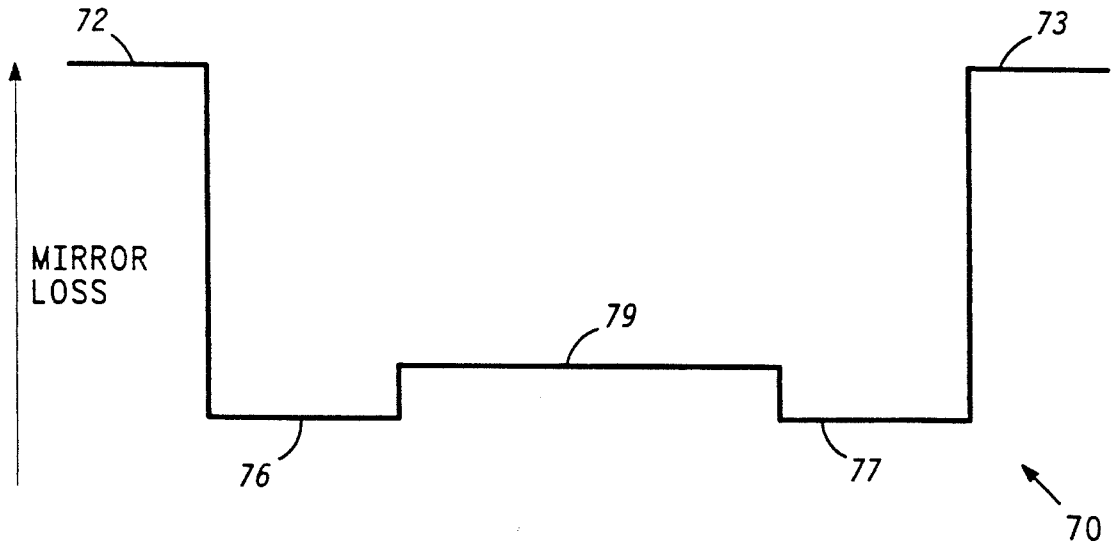
FIG. 5 is a graphical representation of the mirror loss, or reflectivity profile, in another VCSEL similar to that of FIG. 2.

Referring specifically to FIG. 5, a graphical representation of the mirror loss, or reflectivity profile 70, in another VCSEL similar to VCSEL 25 is illustrated. Reflectivity profile 70 includes outermost lines 72 and 73, coinciding with trench 39, wherein the mirror loss is a maximum. At the inner ends of each of the lines 72 and 73 the mirror loss drops off sharply, indicating the beginning of the mesa shaped area 40. Lines 76 and 77, immediately inward from the sharp drop offs of mirror loss, indicate the mirror loss from the outer edge of mesa shaped area 40 to the outer limits of electrical contact window 42. In this particular embodiment the combined optical thickness of dielectric layer 44 and final ITO layer 46 thereover is approximately equal to a multiple of one half wavelength so that the mirror loss indicated by lines 76 and 77 is a minimum. Also in this particular embodiment, metal contact 46 is constructed to have a thickness, t, equal to a variation between a multiple of one half wavelength and an odd multiple of one quarter wavelength. Thus, the mirror loss increases sharply at electrical contact window 42 to a line 59 indicating a mirror loss in electrical contact window 42 which is greater than minimum.

It can be seen by a comparison of FIGS. 3 and 5 that the diameter, d, of the mesa shaped area in the specific embodiment represented by FIG. 5 is larger than the diameter of the embodiment represented by FIG. 3. The configuration represented by FIG. 5 more closely resembles an unstable resonator in that the optical mode (oval 48) is pushed to larger sizes by the higher reflectivity (lower mirror loss) outside centrally located electrical contact window 42. Depending on the choice of layer thicknesses and the current spreading, it is possible to form a device with a very large fundamental optical mode, for higher power operation, while suppressing higher order modes. It should be understood, however, that this advantage is obtained at the cost of higher threshold currents.

Thus, methods of manufacturing VCSELs with separate control of current distribution and optical mode are disclosed wherein a desired optical mode is determined and layers of material are positioned on the surface of the mesa shaped area with thicknesses that produce a predetermined reflectivity profile which provides the desired optical mode. A desired current configuration is determined and the electrical contact window is defined by a transparent metal contact layer which is deposited on the mesa shaped area. The electrical contact window basically controls the current distribution within the laser. The mesa shaped area is coated with an insulating layer which aids in confining the current to the center of the device for an improved overlap with the optical mode.

The current distribution and optical mode are separately controlled, which allows the final desired embodiment to be achieved with relatively simple operations. Further, because of the separate control of the current distribution and the optical mode, a variety of laser embodiments can be constructed which provide results not previously attainable, e.g. higher efficiency because of better overlap of current and optical mode, and larger more powerful VCSELs because of the optical mode and current distribution capabilities. Further, because the optical mode and current distribution are controlled independently of the mesa edges, tolerances in the masking and formation of the mesa are significantly eased. In some specific applications it may be practical to manufacture lasers, or arrays of lasers, in accordance with the presently explained separate control of optical mode and current distribution without etching the upper mirror stack to form a mesa shaped area.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of manufacturing a vertical cavity surface emitting laser with control of the optical mode, comprising the steps of:
    providing a substrate;

forming a first parallel stack of mirrors on the substrate;

forming an active and spacer layer on the first parallel mirror stack;

forming a second parallel mirror stack on the active and spacer layer; and controlling the optical mode of the laser by depositing material on the second parallel mirror stack having an optical thickness in a range from approximately an odd multiple of a quarter wavelength to a multiple of a half wavelength at the laser emission, which optical thickness provides a predetermined reflectivity profile to control the optical mode of the laser.

2. A method of manufacturing a vertical cavity surface emitting laser with control of the optical mode as set forth in claim 1 including in addition a step of separately controlling current distribution including in the step of depositing material on the second mirror stack, depositing an electrical contact window on the second mirror stack to control the current distribution.

3. A method of manufacturing a vertical cavity surface emitting laser with separate control of current distribution and optical mode, comprising the steps of:
providing a substrate;
forming a first parallel stack of mirrors on the substrate;
forming an active and spacer layer on the first parallel mirror stack;
forming a second parallel mirror stack on the active and spacer layer;
etching the second parallel mirror stack to define a mesa shaped area; and
depositing material on the mesa shaped area having an optical thickness which provides a predetermined reflectivity profile for the mesa shaped area to control the optical mode of the laser, the material being deposited on the mesa shaped area including optically transparent, electrically conductive material defining an electrical contact window to control current distribution within the laser.

4. A method of manufacturing a vertical cavity surface emitting laser with separate control of current distribution and optical mode as set forth in claim 3 wherein the step of depositing material includes forming a layer of dielectric material over the mesa shaped active area after the etching step.

5. A method of manufacturing a vertical cavity surface emitting laser with separate control of current distribution and optical mode as set forth in claim 4 wherein the step of forming a layer of dielectric material includes forming a layer of silicon nitride.

6. A method of manufacturing a vertical cavity surface emitting laser with separate control of current distribution and optical mode as set forth in claim 3 wherein the step of depositing material on the mesa shaped area including optically transparent, electrically conductive material includes depositing one of cadmium tin oxide and indium tin oxide as the optically transparent, electrically conductive material.

7. A method of manufacturing a vertical cavity surface emitting laser with separate control of current distribution and optical mode as set forth in claim 3 wherein the step of depositing material on the mesa shaped area includes the step of depositing on the electrical contact window, material having an optical thickness approximately a multiple of one half wavelength of the laser emission.

8. A method of manufacturing a vertical cavity surface emitting laser with separate control of current distribution and optical mode as set forth in claim 7 wherein the step of depositing material on the mesa shaped area further includes the step of depositing on portions of the mesa shaped area other than the electrical contact window, material having an optical thickness different than a multiple of one half wavelength of the laser emission.

9. A method of manufacturing a vertical cavity surface emitting laser with separate control of current distribution and optical mode as set forth in claim 4 wherein the step of depositing material on the mesa shaped area further includes the step of depositing on portions of the mesa shaped area other than the electrical contact window, material having an optical thickness approximately a multiple of one half wavelength of the laser emission.

10. A method of manufacturing a vertical cavity surface emitting laser with separate control of current distribution and optical mode as set forth in claim 9 wherein the step of depositing material on the mesa shaped area includes the step of depositing on the electrical contact window, material having an optical thickness different than a multiple of one half wavelength of the laser emission.

11. A method of manufacturing a vertical cavity surface emitting laser with separate control of current distribution and optical mode, comprising the steps of:
providing a substrate;
forming a first parallel stack of mirrors on the substrate;
forming an active and spacer layer on the first parallel mirror stack;
forming a second parallel mirror stack on the active and spacer layer;
determining a desired reflectivity profile for the vertical cavity surface emitting laser to control the optical mode of the laser and determining a desired current configuration;
etching the second parallel mirror stack to define a mesa shaped area;
depositing a layer of dielectric material on the mesa shaped area to confine current flowing in the mesa shaped area;
etching an opening through the dielectric layer in the mesa shaped area; and
depositing material on the mesa shaped area including optically transparent, electrically conductive material defining an electrical contact window to control current distribution within the laser to the desired current configuration, the dielectric material and the optically transparent, electrically conductive material being deposited to an optical thickness which provides the desired reflectivity profile for the mesa shaped area.

12. A vertical cavity surface emitting laser with separately controlled current distribution and optical mode, comprising:
a substrate;
a first parallel stack of mirrors positioned on the substrate;
an active and spacer layer positioned on the first parallel mirror stack;
a second parallel mirror stack positioned on the active and spacer layer, the second parallel mirror stack being etched to define a mesa shaped area; and material positioned on the mesa shaped area having an optical thickness such that the mesa shaped area has a predetermined reflectivity profile, the material positioned on the mesa shaped area including optically transparent, electrically conductive material defining an electrical contact window to control current distribution within the laser.

13. A vertical cavity surface emitting laser with separate control of current distribution and optical mode as set forth in claim 12 wherein the material positioned on the mesa shaped area includes a layer of dielectric material positioned on the mesa shaped active area.

14. A vertical cavity surface emitting laser with separate control of current distribution and optical mode as set forth in claim 13 wherein the material positioned on the mesa shaped area further includes material positioned on the electrical contact window having an optical thickness approximately a multiple of one half wavelength of the laser emission.

15. A vertical cavity surface emitting laser with separate control of current distribution and optical mode as set forth in claim 14 wherein the material positioned on the mesa shaped area further includes material, positioned on portions of the mesa shaped area other than the electrical contact window, having an optical thickness different than a multiple of one half wavelength of the laser emission.

16. A vertical cavity surface emitting laser with separate control of current distribution and optical mode as set forth in claim 13 wherein the material positioned on the mesa shaped area includes material, positioned on portions of the mesa shaped area other than the electrical contact window, having an optical thickness approximately a multiple of one half wavelength of the laser emission.

17. A vertical cavity surface emitting laser with separate control of current distribution and optical mode as set forth in claim 16 wherein the material on the mesa shaped area further includes material positioned on the electrical contact window having an optical thickness different than a multiple of one half wavelength of the laser emission.

18. A vertical cavity surface emitting laser with separate control of current distribution and optical mode as set forth in claim 13 wherein the layer of dielectric material includes silicon nitride.

19. A vertical cavity surface emitting laser with separate control of current distribution and optical mode as set forth in claim 13 wherein the material on the mesa shaped area includes an optically transparent metal for an electrical contact.

20. A vertical cavity surface emitting laser with separate control of current distribution and optical mode as set forth in claim 19 wherein the optically transparent metal includes one of indium tin oxide and cadmium tin oxide.

21. A vertical cavity surface emitting laser with separately controlled optical mode, comprising:
   a substrate;
   a first parallel stack of mirrors positioned on the substrate;
   an active and spacer layer positioned on the first parallel mirror stack;
   a second parallel mirror stack positioned on the active and spacer layer; and
   material positioned on the second parallel mirror stack having an optical thickness in a range from approximately an odd multiple of a quarter wavelength to a multiple of a half wavelength at the laser emission such that the second parallel mirror stack has a predetermined reflectivity profile.

22. A vertical cavity surface emitting laser with separately controlled optical mode as claimed in claim 21 wherein the material positioned on the second parallel mirror stack includes optically transparent, electrically conductive material defining an electrical contact window to control current distribution within the laser.

* * * * *